(12) United States Patent
Moser et al.

(10) Patent No.: US 11,249,317 B2
(45) Date of Patent: Feb. 15, 2022

(54) DEVICE FOR COLLIMATING A LIGHT BEAM, HIGH-POWER LASER, AND FOCUSING OPTICAL UNIT AND METHOD FOR COLLIMATING A LIGHT BEAM

(71) Applicant: FISBA AG, St. Gallen (CH)

(72) Inventors: Hansruedi Moser, Hinterforst (CH); Hans Forrer, St. Gallen (CH); Martin Forrer, Appenzell (CH); Michael Huber, St. Gallen (CH)

(73) Assignee: FISBA AG, St. Gallen (CH)

( * ) Notice: Subject to any disclaimer, the term of this patent is extended or adjusted under 35 U.S.C. 154(b) by 214 days.

(21) Appl. No.: 16/471,021

(22) PCT Filed: Jan. 29, 2018

(86) PCT No.: PCT/EP2018/052061
§ 371 (c)(1),
(2) Date: Jun. 19, 2019

(87) PCT Pub. No.: WO2018/141670
PCT Pub. Date: Aug. 9, 2018

(65) Prior Publication Data
US 2020/0018979 A1    Jan. 16, 2020

(30) Foreign Application Priority Data

Jan. 31, 2017 (EP) ..................... 17153942

(51) Int. Cl.
*G02B 27/09* (2006.01)
*G02B 19/00* (2006.01)
*H01S 5/40* (2006.01)

(52) U.S. Cl.
CPC ..... *G02B 27/0922* (2013.01); *G02B 19/0052* (2013.01); *G02B 27/0961* (2013.01); *H01S 5/4025* (2013.01)

(58) Field of Classification Search
CPC ............ G02B 27/0922; G02B 19/0052; G02B 27/0961; G02B 19/0014; G02B 27/30;
(Continued)

(56) References Cited

U.S. PATENT DOCUMENTS 5,553,174 A * 9/1996 Snyder ................. G02B 6/4206
385/15
5,790,576 A 8/1998 Waarts et al.
(Continued)

OTHER PUBLICATIONS

Mitsuo Nohara et al., "Aspheric Lens Laser Diode Collimator Design for Optical Intersatellite Communications", Japanese Journal of Applied Physics, vol. 33, No. Part 1, No. 3A, Mar. 15, 1994, pp. 1363-1364 See Spec., p. 3 See International Search.
(Continued)

*Primary Examiner* — Robert E. Tallman
(74) *Attorney, Agent, or Firm* — Finch & Maloney, PLLC; Michael Bujold; Jay Franklin (57) ABSTRACT

A device for collimating a light radiation field of a light source (L) having a beam characteristic which is different in a first plane (FAC) from that of a second plane (SAC). The device comprises at least one first collimating lens (10) and a second collimating lens (20). The device has an additional optical element (30) in order to collimate the light radiation field in different planes to the first and to the second plane.

12 Claims, 7 Drawing Sheets

(58) Field of Classification Search
CPC .. G02B 6/4296; G02B 27/0916; H01S 5/4025
See application file for complete search history.

(56) References Cited

U.S. PATENT DOCUMENTS

| | | | | |
|---|---|---|---|---|
| 6,195,208 | B1* | 2/2001 | Ngoi | G02B 27/09 359/641 |
| 6,201,229 | B1* | 3/2001 | Tawa | G11B 7/1378 250/201.5 |
| 6,356,395 | B1* | 3/2002 | Tawa | G02B 3/0056 359/641 |
| 9,343,868 | B2* | 5/2016 | Sipes, Jr. | G02B 19/0014 |
| 2015/0049779 | A1* | 2/2015 | Kontani | G02B 27/30 372/101 |
| 2016/0274368 | A1 | 9/2016 | Gurevich | |

OTHER PUBLICATIONS

International Search Corresponding to PCT/EP2018/052061 dated May 22, 2018.
Written Opinion Corresponding to PCT/EP2018/052061 dated May 22, 2018.
European Office Action Corresponding to 18705099.2 dated Sep. 1, 2021.
Hunten et al., "Precision Glass Molding: An Integrative Approach for the Production of High Precision Micro-Optics", Proceedings of Spie, vol. 7591, p. 75910X-1-75910X-10, Downloaded Nov. 17, 2020.
Aspheric Lens, Wikipedia, Downloaded Oct. 7, 2020.
Serkan et al., "Optical Beam-Shaped Design Based on Aspherical Lenses for Circularization, Collimation, and Expansion of Elliptical Laser Beans", Applied Optics, vol. 47, No. 2, Jan. 10, 2008.

* cited by examiner

DEVICE FOR COLLIMATING A LIGHT BEAM, HIGH-POWER LASER, AND FOCUSING OPTICAL UNIT AND METHOD FOR COLLIMATING A LIGHT BEAM

The present invention relates to a device for collimating a light beam, to a high-power laser, and to a focusing optical unit and to a method for collimating a light beam as claimed in the preamble of the independent claims.

Devices for collimating a light beam are used in high-power diode lasers and in quantum cascade lasers, inter alia. Such devices typically find application in lasers having an asymmetrical beam field.

A high-power diode laser is a semiconductor laser having a broad stripe structure in order to enable the emission of high powers as a light beam in the watts range. Such a single emitter generates a light beam from an origin plane with a beam direction predefined relative thereto. Two planes extend along this beam direction, a first plane (fast axis) and a plane orthogonal thereto (slow axis). The beam has a different beam characteristic in the first plane than in the second plane. The single emitter has a dimension of the order of magnitude of 1 micron in the origin plane in the first axis as a single-mode emitter and has a numerical aperture of 0.5-0.7 in this plane. In the slow axis, the single emitter has a dimension of 3-200 microns in the origin plane depending on type in the case of single-mode or multi-mode emitters and the light beam has a numerical aperture of 0.05-0.2 in this plane. This depends on the wavelength and power of the laser source used.

Since these high-power diode lasers are often coupled into an optical waveguide, a light radiation field that is as symmetrical as possible upstream of the focusing optical unit should be endeavored to be attained for focusing. In this case, it is known from the prior art to realize this by means of separate collimation in the fast axis and the slow axis. In this case, firstly the fast axis is collimated by a cylindrical collimation lens FAC (fast axis collimator), only in this plane. Afterward, in the slow axis plane, the portions of the light beams are collimated in this plane by a cylindrical collimation lens SAC (slow axis collimator). The light radiation field downstream of the FAC and SAC is then focused onto the fiber core by a focusing optical unit.

Laser diode arrays having a plurality of emitters on a chip are often used in order to increase the power. In this case, too, an FAC is used for collimation. However, since a plurality of emitters are arranged alongside one another in the origin plane along the slow axis plane, each emitter has to be collimated by a separate SAC. This is usually realized by means of an array of SACs situated alongside one another. In this case, the distance between the SACs has to correspond to the distance between the emitters.

Furthermore, use is also made of chips having a plurality of emitters in the origin plane, which are arranged alongside one another along the fast axis plane. In this case, too, only one FAC is used for collimation since the emitters are at a distance of between 5 and 20 microns. A laser diode array in the slow and fast axis planes is thus possible.

Radiation or portions of the light which propagate neither in the fast axis plane nor in the slow axis plane, however, are collimated only to an insufficient extent. This results in a blurred and in part unsharp field. This can result in a power loss, for example upon coupling into an optical fiber guide, since the complete radiation cannot be coupled in, but rather substantially only that part which is completely collimated.

The numerical aperture is typically greater in the case of short-wave light beams, for example from a blue laser diode having a wavelength of approximately 450 nm. This likewise results in greater losses.

The document Jpn. J Appl. Phys. Vol. 33 (1994) pp. 1363-1364 discloses a collimation arrangement comprising aspherical lenses, wherein circular collimation is firstly effected by means of one lens and two cylindrical lenses are arranged in the further beam path. Alternatively, two anamorphic lenses, each of which is convex on one side and concave on the other side, can be arranged successively.

The document US 2016/0274368 A1 discloses a diode arrangement comprising an array of diodes each provided with a "fast axis" collimator. In the emission direction there follows an array of spherical/aspherical telescope units and subsequently an array of cylindrical lenses. Finally, the arrangement comprises a focusing unit having collimating lenses.

The document U.S. Pat. No. 6,195,208 B1 discloses an aspherical lens that converts an astigmatic, non-circular, divergent laser beam into a collimated, circular laser beam. The input surface has a concave aspherical profile in the transverse direction and a convex aspherical profile in the longitudinal direction, and the output surface has a convex aspherical profile in the transverse direction and a non-curved profile in the longitudinal direction.

It is an object of the invention to eliminate these and further disadvantages of the prior art.

This object is achieved by means of the devices and methods defined in the independent patent claims. Further embodiments are evident from the dependent patent claims.

The object is achieved by means of a device according to the invention for collimating an incoming light radiation field with a beam characteristic in regard to the divergence, that is to say with regard to the emission angle relative to the direction, which is different in a first plane than in a second plane. The light radiation field comprises at least one light beam which is emitted by a light source and which, in the beam direction, diverges rapidly along a fast axis and diverges more slowly along a slow axis perpendicular thereto. The first plane is preferably spanned by the fast axis direction of the light emitter and the beam direction, and the second plane is preferably spanned by the slow axis direction of the light emitter and the beam direction, such that the planes are orthogonal to one another. The emission angle in the first plane along the beam direction thus differs from the emission angle in the second plane along the beam direction.

The device serves for collimating incoming light beams which have a non-circular cross section perpendicular to the beam direction and, in particular, cannot be focused by a spherical focusing lens, as is usually the case for light beams generated by laser diodes.

The device comprises at least one first collimation lens for collimating the light radiation field in the first plane and at least one second collimation lens for collimating the light beam field in the second plane.

The collimation lenses for the orthogonal planes are arranged one behind another in the emission direction. The first and second collimation lenses can typically be arranged such that firstly the collimation in the fast axis plane and subsequently a collimation in the slow axis plane are effected. The slow axis collimation is effected for example by a circular- or partly circular-cylindrical lens, and the fast axis collimation by a cylindrical lens having a polynomial profile. The slow axis collimation can likewise be effected by a cylindrical lens having a polynomial profile.

The collimation has the effect that the respective divergent portions of the light radiation field are aligned parallel to the beam direction. However, the light radiation field comprises portions which have not yet been aligned parallel after the first collimation, for example the fast axis collimation, and the second collimation, for example the slow axis collimation. If the light radiation field is focused by a focusing optical unit without correction directly after the first and second collimations, for example the fast axis collimation and the slow axis collimation, then these portions are not imaged or are imaged only to an insufficient extent in the target area and can result in a power loss.

According to the invention, the device comprises an additional optical element configured in such a way that portions of the light radiation field which have not yet been aligned parallel by the first and second collimation lenses, that is to say for example after the fast axis collimation and the slow axis collimation, are aligned parallel to the beam direction.

In particular, substantially all portions which have not yet been aligned parallel are aligned parallel by the optical element. The light beam is collimated in particular at least in a plane that is different than the first plane and than the second plane and that likewise extends along the beam direction, and in particular in all planes that are different than the first plane and than the second plane. In particular, the light beam is not collimated in the first and second planes by the further optical element.

The optical element is arranged in the beam direction preferably downstream of the first collimation lens and preferably downstream of the second collimation lens.

As set out in the present case, the incoming light beam has by its nature a fast axis plane and a slow axis plane. Between these planes, the light beam has portions of "skew" propagation directions which propagate not just in these planes and which cannot be collimated, that is to say aligned parallel to the beam direction, by a fast axis collimation and the slow axis collimation. These portions of the light beam can likewise be collimated by the additional optical element.

The portions of the light beam that have already been aligned in the fast axis collimation and the slow axis collimation remain uninfluenced by the additional element.

The device is configured such that the outgoing light radiation field has substantially only portions aligned parallel to the beam direction.

This enables a complete collimation of the light radiation field and hence an increase in power since a larger proportion of the light radiation field in comparison with the prior art is collimated and can therefore be focused. That is to say that a larger proportion of the light radiation field can be focused into a specific region by a focusing optical unit.

The additional optical element can be formed by a separate collimation lens independently of the first and second collimation lenses.

It is conceivable for the first and second collimation lenses to be formed integrally, such that the first and second lenses are also formed by the same physical element.

The additional optical element can be formed by a third collimation lens.

A third collimation lens makes it possible to manufacture the latter with curvature designed specifically for the portions of the "skew" propagation directions.

In this case, it is possible to arrange the third collimation lens in the beam direction of the light beam downstream of the first collimation lens and downstream of the second collimation lens.

This makes it possible to carry out the collimation in three steps, wherein the collimation in the fast axis is carried out in a first step, the collimation in the slow axis is carried out in a second step, and the collimation of the "skew" propagation directions, that is to say of the portions of the light lying on neither of these two planes, is carried out in a third step.

The arrangement of the third collimation lens, that is to say of the additional optical element, at the end of the collimation chain affords the advantage that a large part of the light radiation field has already been collimated in the fast axis plane and the slow axis plane and only the portions of the "skew" propagation directions which do not lie in these planes have to be collimated to completion by the additional element.

The portion of the "skew" propagation directions in these planes is typically already precollimated by the first and second collimation lenses. However, complete collimation does not take place in this case. These portions of the light radiation field are then collimated to completion by the additional optical element, such that thereafter substantially the entire light radiation field is collimated.

However, it is likewise conceivable to arrange the third collimation lens in the beam direction between the first and second collimation lenses.

Depending on the corresponding requirements, it can be advantageous to collimate those portions of the light radiation field which are not collimatable by the fast axis collimation and the slow axis collimation, that is to say which do not lie on the principal axes, before the main portion of the light is collimated for example in the slow axis. This makes it possible, already before a final collimation, wholly or partly to precollimate the "skew" propagation directions of the light.

Preferably, however, the additional optical element is formed by a region on the second collimation lens. With particular preference, the additional optical element is formed as an integral part of the second collimation lens.

This makes it possible to dispense with a third, separate element. The structural size of the device can thus be kept small. Since only two lenses have to be aligned, this results in a device having a higher precision in comparison with a device having a third collimation lens. An increase in quality is thus possible.

In this case, the device preferably consists of a first and a second collimation lens, wherein the second collimation lens comprises the optical element.

Collimation lenses typically have an entrance side and an exit side, as viewed in the radiation direction. Provision can be made for arranging the region for the additional optical element on the entrance side of the second collimation lens and for arranging the surface for collimating the light radiation field in the second plane on the exit side on the second collimation lens in the radiation direction.

This makes it possible, in a manner similar to that in the case of a third collimation lens, to manufacture the second surface for collimating the light radiation field and the optical element independently of the other optical elements, such as the other collimation lenses, and to configure them according to the requirements.

However, it is also conceivable to combine the surface for collimating the light radiation field in the second plane with the additional optical element and to arrange them on the exit side on the second collimation lens in the radiation direction. It would likewise be possible and conceivable to arrange this combination on the entrance side in the radiation direction.

The corresponding surface of the lens is then formed as a freeform surface. That is to say that this surface can be curved differently in different directions in accordance with the characteristic of the entering light beam, in such a way that in addition to the collimation of the main portion of the light in the slow axis the portion of the light beam which is aligned parallel neither by a slow axis collimation nor by a fast axis collimation is likewise collimated.

It is likewise conceivable for the additional optical element to be formed by a region on the first collimation lens and preferably to be formed as an integral part of the first collimation lens.

In this case, additionally or alternatively provision can be made for arranging the region for the additional optical element on the entrance side of the first collimation lens and for arranging the surface for collimating the light radiation field in the first plane on the exit side on the first collimation lens in the radiation direction.

This makes it possible, in a manner similar to that in the case of a third collimation lens, to manufacture the first surface for collimating the light radiation field and the optical element independently of the other optical elements, such as the other collimation lenses, and to configure them according to the requirements.

However, it is also conceivable here to combine the surface for collimating the light radiation field in the first plane with the additional optical element and to arrange them on the exit side on the first collimation lens in the radiation direction. It would likewise be possible and conceivable to arrange this combination on the entrance side on the first collimation lens in the radiation direction.

The corresponding surface of the lens is then formed as a freeform surface. That is to say that this surface could be curved differently in different directions in accordance with the characteristic of the entering light beam, in such a way that in addition to the collimation of the main portion of the light in the fast axis the portion of the light which lies neither on the slow nor on the fast axis is likewise collimated.

Preferably, the additional optical element is formed as part of a freeform surface, wherein the surface thereof has at least two different curvatures in two different directions perpendicular to the beam direction and wherein at least one of the curvatures along a direction perpendicular to the beam direction does not have a constant radius of curvature.

By way of example, the surface can be curved convexly in the direction of the slow axis and can likewise be curved, in particular concavely, in the direction perpendicular thereto.

This makes it possible equally to collimate and to focus light beams having different entrance directions.

Preferably, the freeform surface is curved aspherically along the fast axis direction and/or the slow axis direction.

Preferably, a collimating lens comprising the additional optical element has a surface topography in the form of a two-dimensional even-order polynomial.

Preferably, the polynomial has coefficients having a value of less than or less than or equal to zero for the $x^{2n}$ terms; in particular, at least the coefficients of the $x^2$ and $x^4$ terms are less than zero. In particular, the coefficients of the $y^{2n}$ terms are equal to zero. Preferably, the polynomial has coefficients having a value of greater than or greater than or equal to zero for the $x^{2n}y^{2m}$ terms; in particular, at least the coefficient of the $x^2y^2$ term is greater than zero.

The polynomial has for example the form $$H(x,y) = a_{20}x^2 + a_{40}x^4 + a_{22}x^2y^2 + a_{60}x^6 + a_{42}x^4y^2 + a_{24}x^2y^4$$

wherein H indicates the height of the surface in the beam direction and wherein x and y are the orthogonal coordinate axes in the plane perpendicular to the beam direction, wherein in particular the x-axis extends in the direction of the slow axis direction and the y-axis extends in the direction of the fast axis direction, and a are specific coefficients, preferably all of which are not zero, depending on the emitter.

The coefficients $a_{20}$, $a_{40}$ and $a_{60}$ are less than or less than or equal to zero; preferably, $a_{20}$ and $a_{40}$ are less than zero. These portions of the polynomial describe per se a cylindrical lens and preferably bring about the slow axis collimation.

The coefficients of the mixed terms $a_{22}$ and $a_{42}$ are greater than or greater than or equal to zero; preferably, $a_{22}$ is greater than zero.

It is likewise conceivable for the first collimation lens and the second collimation lens and the additional optical element to be formed integrally. In this case, it is advantageous if this integral element has an optical entrance surface and an optical exit surface, wherein these surfaces can be formed in accordance with the present description. In this regard, by way of example, the entrance surface can wholly or partly collimate the light radiation field in the fast axis plane and the "skew portions" of the light radiation field, and the exit surface can wholly or partly collimate the light radiation field in the slow axis plane. It is likewise conceivable for the light radiation field in the slow axis plane and the skew portions of the light radiation field to be wholly or partly collimated jointly.

This makes it possible to combine three collimations in the fast axis plane, the slow axis plane and all planes therebetween in one element having two optical surfaces (entrance and exit surfaces). As a result, the precision can be increased, with at the same time a simpler manufacturing using fewer individual parts.

A further aspect of the invention relates to a high-power diode laser comprising at least one emitter, preferably a plurality of emitters, and at least one device as described in the present case. In particular, the high-power diode laser comprises a laser diode bar, wherein a multiplicity of laser diodes are arranged alongside one another.

Together with the device for collimation as described above, a corresponding high-power diode laser having a selected characteristic can be provided, said high-power diode laser having a higher efficiency in comparison with the prior art as a result of an improved collimation of the entire emitted radiation.

The proposed high-power diode laser can comprise an array of a plurality of emitters arranged alongside one another in an origin plane along the fast axis or along the slow axis plane. The array generates a light radiation field composed of the light beams of the respective emitters.

In this case, in particular, a slow axis collimator and a fast axis collimator and an additional optical element are assigned to each emitter.

One aspect of the invention therefore relates to an array comprising a plurality of collimation lenses, in particular for a high-power diode laser or a module as described in the present case.

This collimation lens array comprises one, two or a plurality of first collimation lenses for collimating the light radiation field in a first plane and/or one, two or a plurality of second collimation lenses for collimating the light beam in a second plane, wherein the planes are perpendicular to one another and intersect the beam direction.

The first and second collimation lenses are preferably arranged one behind another in relation to the beam direction. The collimation lens array has an additional optical element per first and/or second collimation lens in order that the "skew" propagation directions of the light radiation field are also aligned parallel to the beam direction, that is to say are collimated, in particular are collimated in a plane that is different than the first plane and than the second plane. Here the optical element is preferably manufactured in each case as a freeform surface on the corresponding first and/or second collimation lens.

The optical element is preferably arranged downstream of the first collimation lenses and with further preference downstream of the second collimation lenses in relation to the beam direction.

The collimation in the first plane can be realized with a common collimation lens for all of the emitters since the emitters lie alongside one another very accurately in the slow axis.

For the fast axis collimation of a laser diode bar, a cylindrical lens can be used, for example, which extends over the entire length of the laser diode bar, and the cylinder axis extends parallel to the longitudinal direction of the bar. For the slow axis collimation, a lens array having cylindrical lenses arranged alongside one another can be used, wherein the cylinder axes are aligned perpendicular to the beam direction and perpendicular to the longitudinal direction of the bar.

This makes it possible to provide a high-power diode laser having a high power, wherein each individual emitter is individually collimatable, which enables a maximum efficiency. This arrangement enables a higher power density during focusing within a predefined region since the "skew" propagation directions of the light radiation field are completely collimated for each emitter.

A further aspect of the invention relates to a module comprising a device for collimation, as described above, and a focusing optical unit or a module comprising a high-power diode laser, as described above, and a focusing optical unit.

As a result, it is possible to provide a light beam or a light radiation field having the characteristic described in the present case, in particular having light radiation field portions aligned parallel to the beam direction, and the advantages described in the present case, such that coupling into a corresponding element with high efficiency is possible.

A further aspect of the invention likewise relates to a method for collimating a light beam with a beam characteristic which, with regard to the emission angle, is different in a first plane than in a second plane. Preferably, the method is carried out by means of a device as described in the present case or a high-power diode laser described in the present case or a module as described in the present case. The method comprises the following steps:
   first collimation of portions of the light beam of a first plane, in particular fast axis collimation,
   second collimation of portions of the light beam of a second plane, in particular slow axis collimation,
   third collimation of portions of the light radiation field which have not yet been aligned parallel to the beam direction by the first and second collimations, in particular which have a direction different than the first plane and than the second plane.

This method makes it possible to collimate a higher proportion of the light radiation field and to make it available for a later focusing optical unit. The power density is increased as a result.

Preferably, in this case, two collimations are carried out in a combined manner, that is to say by means of an optical element, in particular the second and third collimations, that is to say the collimation of portions of the light radiation field of a second plane and the collimation of the portions of the light radiation field which have a different plane both with respect to the first plane and with respect to the second plane.

The invention is explained with reference to the following figures, in which.

Figure 1:
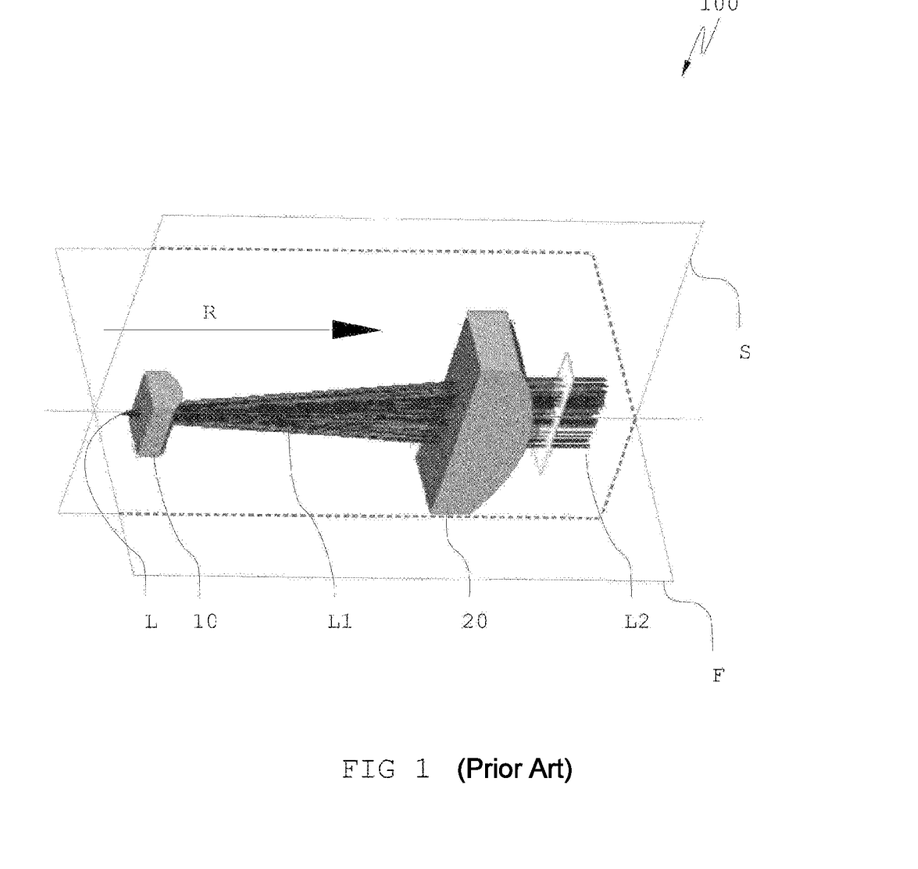
FIG. 1: shows a device in accordance with the prior art

FIG. 1 shows a device for collimating a light beam in accordance with the prior art. The light radiation field L of a light source (of an emitter) has a beam direction R and passes successively through a first collimation lens 10 and a second collimation lens 20.

The light source (emitter) is not shown in the present figure. The emitter defines an origin plane from which the light radiation field L extends with a beam direction R. Two planes extend along this beam direction R, a first plane F (fast axis) and a plane S orthogonal thereto (slow axis), which intersect in the beam direction. The light radiation field L has a different beam characteristic with regard to divergence in the first plane F than in the second plane S.

In this case, the portion of the light radiation field is collimated in the fast axis plane F in the first collimation lens 10. The light radiation field L then has a new characteristic and is referred to as light radiation field L1. The light radiation field L1 enters the second collimation lens 20, which collimates the light in the slow axis plane S. The directed (collimated) light radiation field L1 in turn has a new characteristic downstream of the second collimation lens 20 and is referred to as light radiation field L2.

Figure 1A:
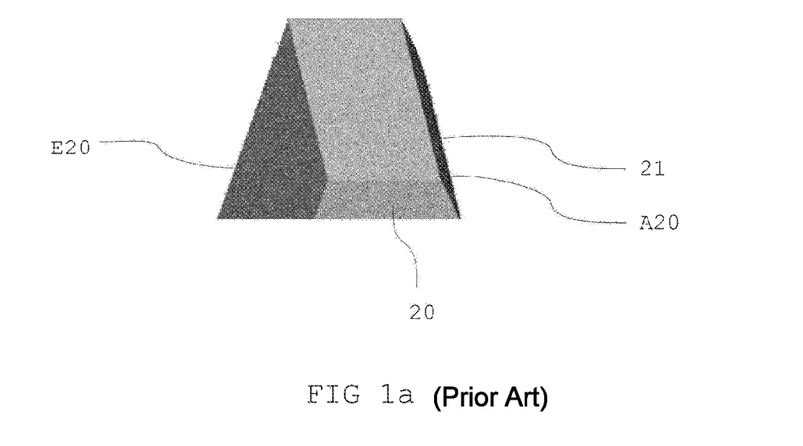
FIG. 1a: shows a detail of the device in accordance with FIG. 1
   FIG. 2: shows the light radiation field after the collimation in the first and second planes of the device in accordance with FIG. 1
   FIG. 3: shows one exemplary embodiment of the device according to the invention

FIG. 1a shows a detail of the collimation lens 20 from FIG. 1 having an entrance side E20 and an exit side A20. A surface 21 for collimating the light radiation field in the second plane is arranged at the exit side A20. The surface 21 is formed in a cylindrical fashion in the present case.

Figure 2:
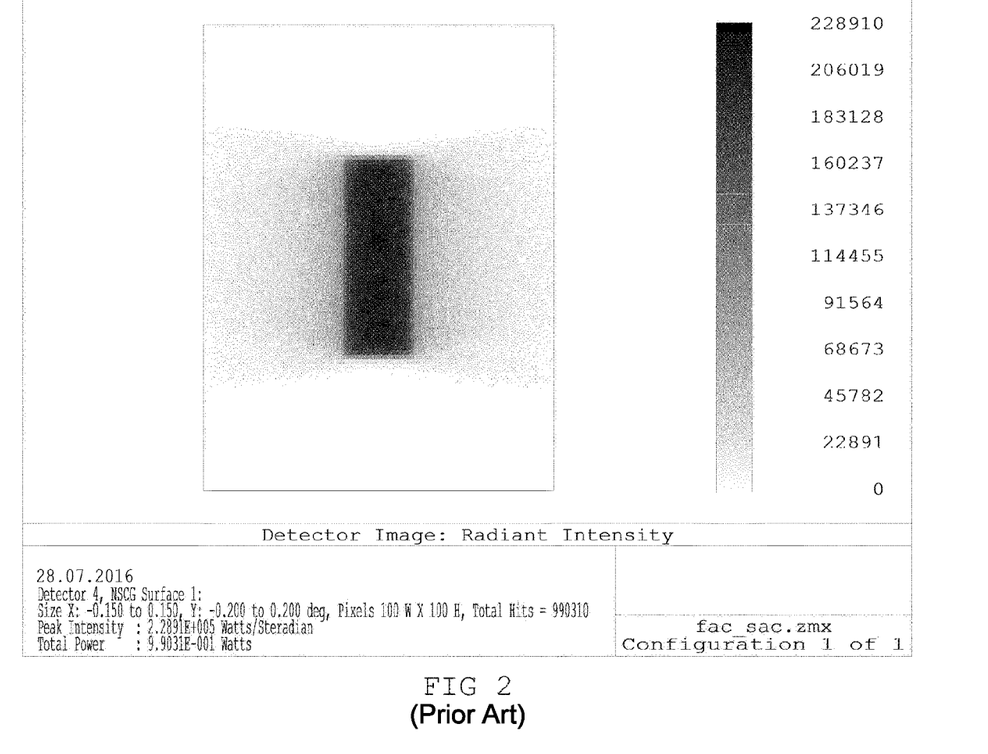

FIG. 2 shows a simulation of the field after an FAC and SAC collimation by a device from the prior art in accordance with FIG. 1. The blurred regions at the edge of the field are discernible, which result from the non-collimated portions of the light radiation field which lie on neither of the two planes.

Figure 3:
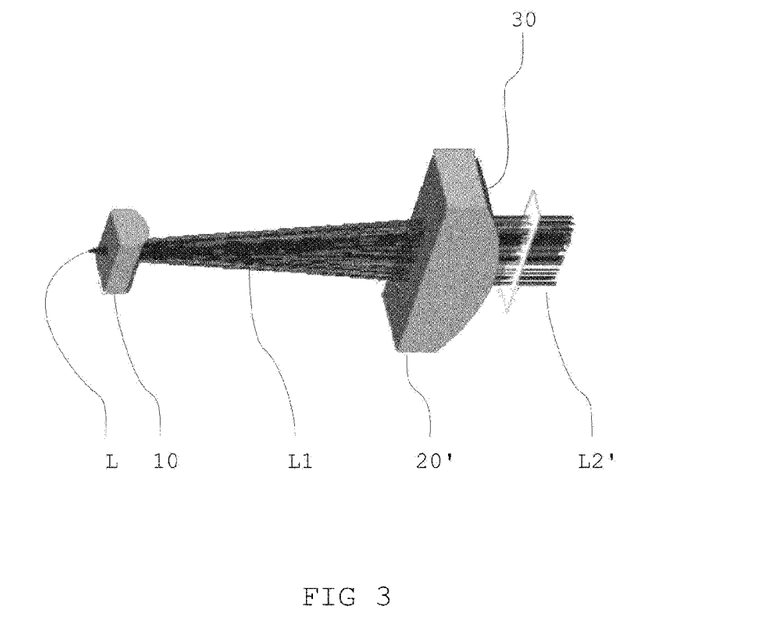
Figure 7:
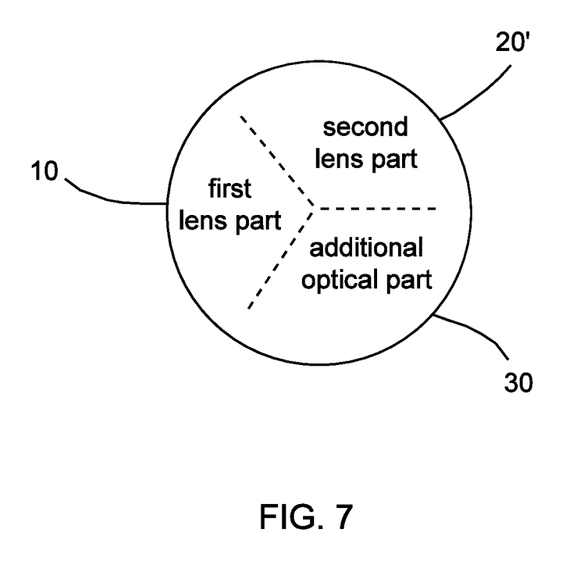
FIG. 7: diagrammatically shows another exemplary embodiment of the device according to the invention.

FIG. 3 shows one embodiment of the device according to the invention. In terms of its construction, the device from FIG. 3 corresponds to the device from FIG. 1 with a first collimation lens 10 and a collimation lens 20'. The second collimation lens 20' is formed with an additional optical element 30 in the present case. Likewise as in FIG. 1, the light radiation field of a light source L firstly passes through the first collimation lens 10 and then propagates as light radiation field L1 further through the second collimation lens 20' and leaves the second collimation lens 20' as light radiation field L2'. In another embodiment, which is diagrammatically shown in FIG. 7, the device according to the invention is formed as a single collimating lens having a first collimation lens part 10, a second collimation lens part 20' and an additional optical element part 30 which are integrally formed as one element.

Figure 3A:
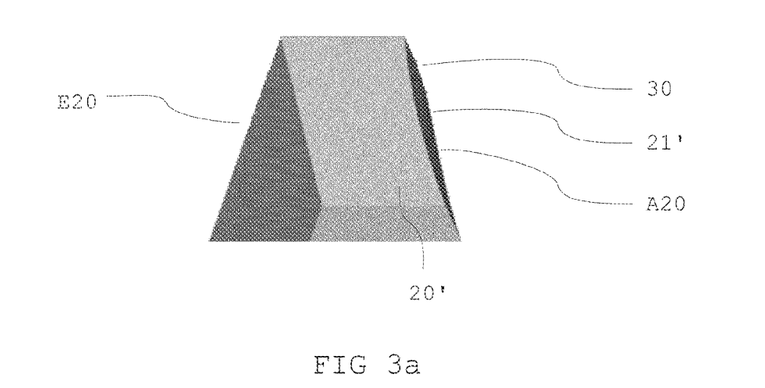
FIG. 3a: shows a detail of the device from FIG. 3
   FIG. 4: shows the light radiation field after the collimation of the device from FIG. 3
   FIGS. 5a to 6c: show comparative experiments concerning the devices from FIGS. 1 and 3.

FIG. 3a shows the detail from FIG. 3 corresponding to FIG. 1, namely a part of the lens of the second collimation lens 20'. The collimation lens 20' has the entrance side E20 and the exit side A20. A surface 21' for collimating the light radiation field in the second plane is manufactured integrally with the second additional optical element 30. The surface 21' is formed basically in a cylindrical fashion with a polynomial curvature in a manner similar to the surface 21 from FIG. 2a.

However, this cylindrical embodiment is superimposed with a freeform surface forming the additional optical element 30. In the present case, the region of the combined surfaces 30, 21', in addition to the convexity of the basically cylindrical embodiment, is formed in a slightly concave fashion transversely with respect thereto.

The freeform surface is fashioned according to the formula $$h(x,y)=a_{20}x^2+a_{40}x^4+a_{22}x^2y^2+a_{60}x^6+a_{42}x^4y^2+a_{24}x^2y^4.$$

This enables the collimation of the light radiation field in the slow axis plane and additionally the collimation of the light which propagates neither in the slow axis plane nor in the fast axis plane.

The freeform surface can be fashioned in particular according to the polynomial $$h(x,y)=a_{20}*x^2+a_{22}*x^2*y^2+a_{40}*x^4$$

wherein $a_{20}$ and $a_{40}$ are less than zero and $a_{22}$ is greater than zero, for example $a_{20}=-6.250e^{-02}$, $a_{22}=-2.14e^{-03}$ and $a_{04}=-1.07e^{-04}$. The value of the coefficients is typically defined depending on the refractive power of the collimation lens, that is to say for example on the type and thickness of the glass.

Figure 4:
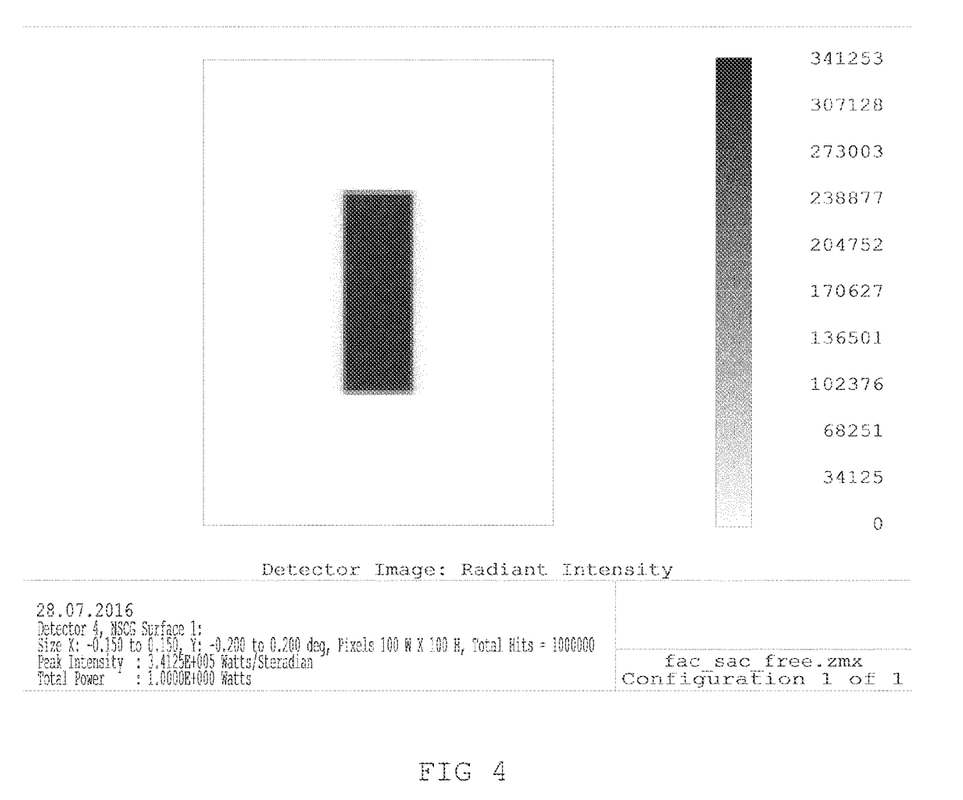

FIG. 4 shows a simulation of the light radiation field after FAC and SAC in combination with the additional collimation by the element 30 in the different plane with respect thereto. In contrast to the simulation from FIG. 2, blurred edge regions are no longer evident here. The energy in a defined region is increased. This is also shown in FIGS. 5a to c (prior art in accordance with FIG. 1) in comparison with FIGS. 6a to c (device in accordance with FIG. 3).

Figure 5A:
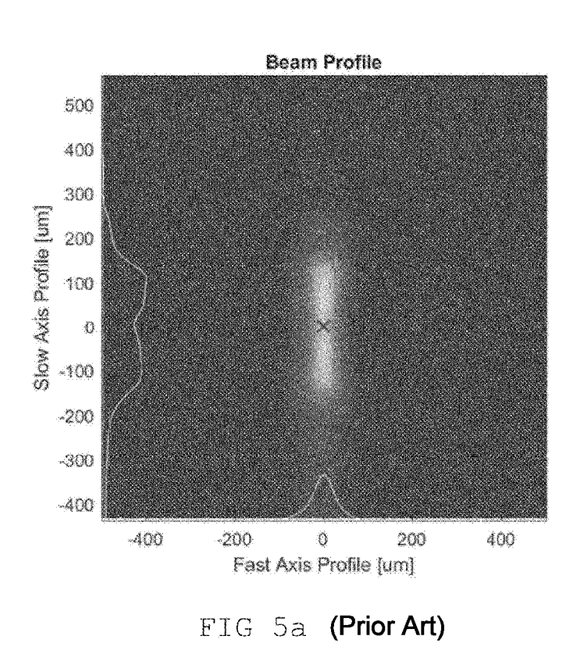
Figure 5B:
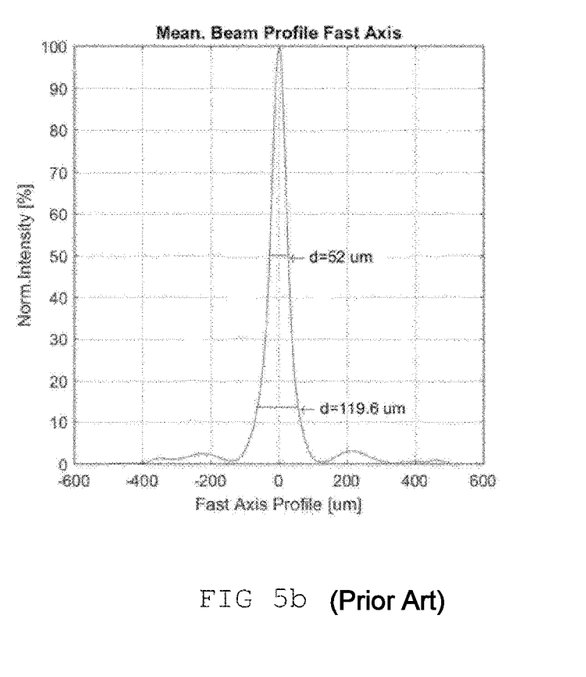
Figure 5C:
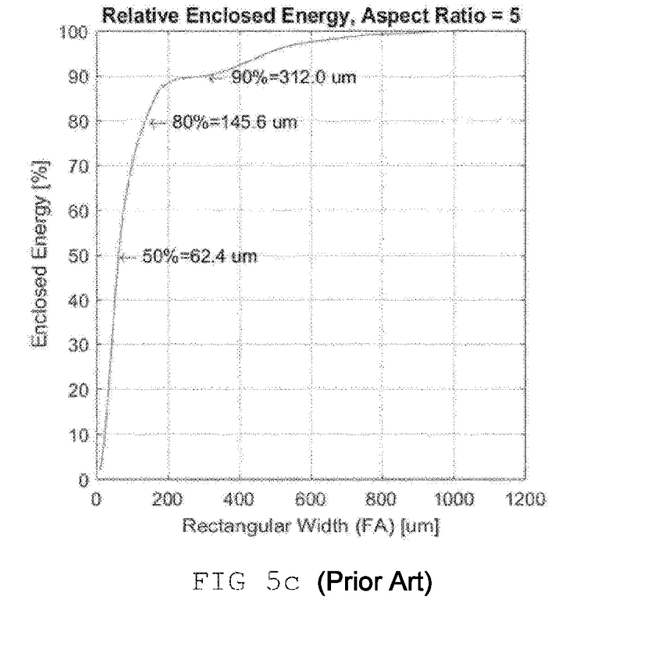
Figure 6A:
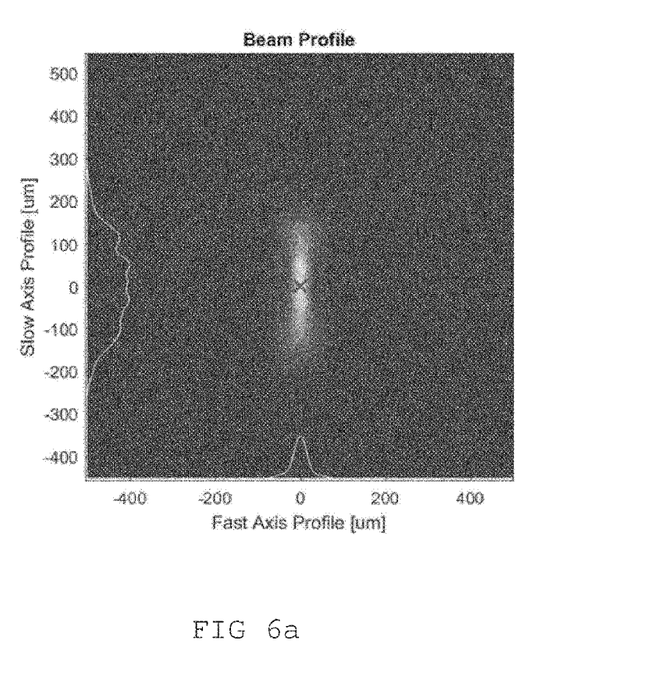
Figure 6B:
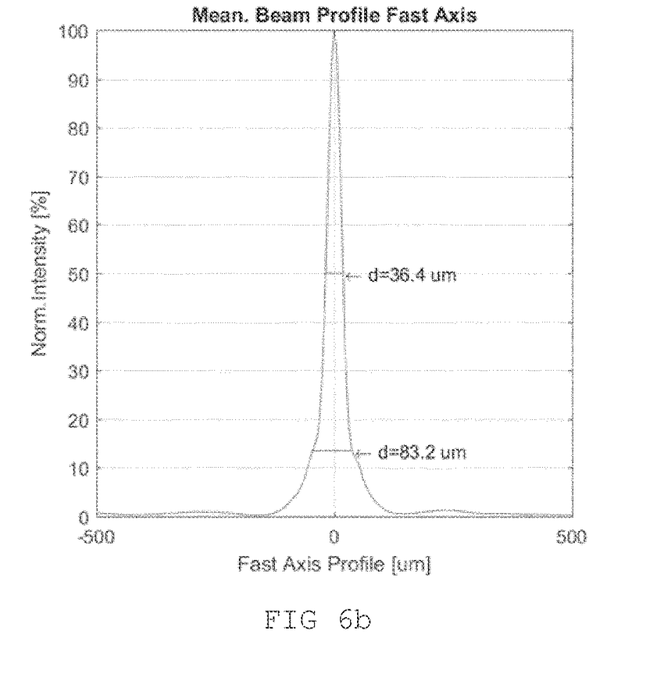
Figure 6C:
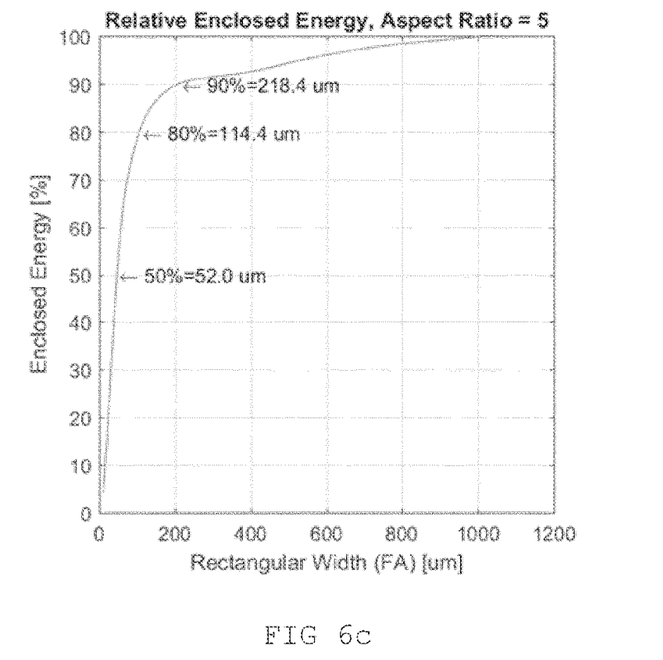

FIGS. 5a and 6a each show the profile of the light radiation field after the collimation and the focusing by a focusing optical unit. In this case, FIG. 6a reveals a smaller widening of the beam profile by the non-optimally collimated "skew" propagation directions, wherein additionally a higher intensity is able to be ascertained centrally. FIGS. 5b and 6b show the normalized beam profile in the fast axis plane. The comparison shows the improvement in the beam cross section and the reduced secondary maxima. FIGS. 5c and 6c show the enclosed energy in a defined region. The comparison shows a significantly improved efficiency of the proposed solution. By way of example, with the solution according to the invention with the used set-up of FAC and SAC or SAC with optimization according to the invention and focusing optical unit, 90% of the energy is focused into a region that is smaller by a factor of 2 in comparison with the prior art.

The invention claimed is:

1. A device for collimating a light radiation field emanating from at least one light emitter with a beam characteristic with regard to an emission angle relative to a beam direction which is different in a first plane than in a second plane, such that the first and the second planes are orthogonal to one another, wherein the first plane is spanned by a fast axis direction of the light emitter and the beam direction, and the second plane is spanned by a slow axis direction of the light emitter and the beam direction, the device comprising:
    at least one first collimation lens part which performs a first function for fast axis collimating the light radiation field in the first plane, and
    at least one second collimation lens part which performs a second function for slow axis collimating the light radiation field in the second plane,
    wherein the device comprises an additional optical element part which performs a third function for collimating unaligned portions of the light radiation field, which have not yet been aligned parallel by the first and the second collimation lens parts, such that the unaligned portions of the light radiation field are aligned parallel to the beam direction and such that the light radiation field is collimated in at least one further plane that is different than the first plane and the second plane,
    the first collimation lens part, the second collimation lens part and the additional optical element part are integrally formed as an integrally formed collimation lens which carries out the first, the second and the third functions in a combined manner, and
    for performing the third function, the additional optical element part of the integrally formed collimation lens has a surface topography which has a form of a two-dimensional even-order polynomial.

2. The device according to claim 1, wherein the additional optical element part is formed by a region on the integrally formed collimation lens.

3. The device according to claim 2, wherein the region is arranged on an entrance side on the integrally formed collimation lens in a radiation direction and a surface of the second collimation lens part for collimating the light radiation field in the second plane is arranged on an exit side on the integrally formed collimation lens in the radiation direction.

4. The device according to claim 2, wherein, in a radiation direction, the region on the integrally formed collimation lens and a surface of the second collimation lens part for collimating the light radiation field in the second plane are arranged on an exit side on the integrally formed collimation lens.

5. The device according to claim 2, wherein the region is arranged on an entrance side on the integrally formed collimation lens in a radiation direction and a surface for collimating the light radiation field in the first plane is arranged on an exit side on the integrally formed collimation lens in the radiation direction.

6. The device according to claim 2, wherein the region is arranged on an exit side on the integrally formed collimation lens in a radiation direction and a surface for collimating the light radiation field in the first plane is arranged on an exit side on the integrally formed collimation lens in the radiation direction.

7. The device according to claim 1, wherein the second integrally formed collimation lens has a surface topography of a form:

$$h(x,y)=a_{20}x^2+a_{40}x^4+a_{22}x^2y^2+a_{60}x^6+a_{42}x^4y^2+a_{24}x^2y^4,$$

wherein h indicates a height of the surface in the beam direction, and x and y are orthogonal coordinate axes in a plane perpendicular to the beam direction (R) and the parameters a are not equal to zero.

8. A high-power diode laser comprising at least one emitter and at least one device according to claim 1.

9. The high-power diode laser according to claim 8 comprising an array of a plurality of emitters arranged alongside one another in an origin plane along the first plane and/or along the second plane, and an additional optical element is assigned to each emitter.

10. A module comprising a device according to claim 1 and a focusing optical unit or comprising a high-power diode laser and the focusing optical unit.

11. A collimation lens array, being designed, for performing a first function of two or a plurality of first collimation lens parts for fast axis collimating a light radiation field in a first plane and being designed for performing a second function of two or a plurality of second collimation lens parts for slow axis collimating the light radiation field in a second plane, which is arranged orthogonally to the first plane and intersects the latter in a line along a beam direction, wherein the collimation lens array is designed for performing a third function of an additional optical element per the first and/or the second collimation lens parts, for additionally collimating unlaigned portions of the light radiation field, which have not yet been aligned parallel to the beam direction by the first and the second collimation lens parts, in a further plane that is different than the first plane and the second plane, wherein the fast axis collimations, the slow axis collimations and the additional collimations are carried out in a combined manner by an integrally formed collimating lens, which comprises the first collimation lens parts, the second collimation lens parts and the additional optical element parts integrally combined, and wherein for performing the third function of the additional optical elements, the integrally formed collimating lens has a surface topography which has a form of a two-dimensional even-order polynomial.

12. A method for collimating a light radiation field with a beam characteristic which is different in a first plane than in a second plane, comprising the following steps:

first fast axis collimating of the portions of the light radiation field of the first plane, second slow axis collimating of the portions of the light radiation field of the second plane, further collimating of portions of the light radiation field which have not yet been aligned parallel to the beam direction by the first and the second collimations, wherein the first, the second and the third collimations are carried out in a combined manner by one integrally formed optical element and wherein the integrally formed optical element has a surface topography which has a form of a two-dimensional even-order polynomial.

\* \* \* \* \*